US007245142B2

(12) United States Patent
Tanaka et al.

(10) Patent No.: US 7,245,142 B2
(45) Date of Patent: Jul. 17, 2007

(54) LIQUID CRYSTAL SUBSTRATE INSPECTION APPARATUS

(75) Inventors: Gaku Tanaka, Hadano (JP); Akira Teramoto, Hadano (JP); Makoto Shinohara, Hadano (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 11/053,936

(22) Filed: Feb. 10, 2005

(65) Prior Publication Data

US 2005/0179426 A1 Aug. 18, 2005

(30) Foreign Application Priority Data

Feb. 17, 2004 (JP) ............................ 2004-039478

(51) Int. Cl.
*G01R 31/00* (2006.01)

(52) U.S. Cl. ...................................................... 324/770

(58) Field of Classification Search ................. 324/770
See application file for complete search history.

(56) References Cited

U.S. PATENT DOCUMENTS

| | | | | |
|---|---|---|---|---|
| 4,899,105 | A * | 2/1990 | Akiyama | 324/770 |
| 5,432,461 | A * | 7/1995 | Henley | 324/770 |
| 6,246,253 | B1 * | 6/2001 | Kang et al. | 324/770 |
| 6,285,207 | B1 * | 9/2001 | Listwan | 324/770 |
| 6,353,466 | B1 * | 3/2002 | Park | 324/770 |
| 6,396,299 | B1 * | 5/2002 | Hayashida | 327/770 |
| 6,759,867 | B2 * | 7/2004 | Sohn | 324/770 |
| 6,765,203 | B1 * | 7/2004 | Abel | 324/770 |
| 6,879,180 | B2 * | 4/2005 | Iwata et al. | 324/770 |

* cited by examiner

*Primary Examiner*—Jermele Hollington
(74) *Attorney, Agent, or Firm*—Manabu Kanesaka

(57) ABSTRACT

A liquid crystal substrate inspection apparatus includes an inspection device for inspecting a liquid crystal substrate and a prober replacing device disposed adjacent to the inspection device. The prober replacing device has a conveying device for conveying a prober for inspecting a liquid crystal substrate. The inspection device and the prober replacing device are arranged next to each other, so that it is possible to shorten an inspection time of the liquid crystal substrate. The prober replacing device has the conveying device for automatically conveying the prober to the inspection device.

9 Claims, 11 Drawing Sheets

LIQUID CRYSTAL SUBSTRATE INSPECTION APPARATUS

BACKGROUND OF THE INVENTION AND RELATED ART STATEMENT

The present invention relates to a liquid crystal substrate inspection apparatus for inspecting a substrate such as a glass substrate of a liquid crystal display and the like, and in particular, relates to a mechanism of replacing a prober for inspecting a substrate.

A liquid crystal substrate has an electrical circuit having plural circuits for driving liquid crystal pixels arranged in a matrix pattern formed on, for example, a glass substrate. A large number of electrode pads are formed around the electrical circuit as electrical contacts. When the electrical circuit formed on the liquid crystal substrate is electrically inspected, a prober with a probe pin electrically contacting an electrode pad of the liquid crystal substrate is used.

The liquid crystal substrates have different sizes, wirings, arrangements of electrode pads, and the like according to applications and specifications. Accordingly, it is necessary to provide a prober corresponding to the liquid crystal substrate to be inspected and replace the prober according to the liquid crystal substrate.

Conventionally, a prober is transported to a chamber manually or with a jig such as a crane to replace the prober. In general, a prober has a weight of several tens of kilograms. Accordingly, a large number of people and labor are required in order to transport the prober manually, and it takes long time. When the liquid crystal substrate is inspected on an inspection line, it is necessary to temporarily shut down the inspection line each time the prober is replaced. In order to shorten the shutdown time of the inspection line, it is necessary to replace the prober quickly. However, when the prober is replaced manually, it is difficult to shorten a time of replacing.

When a prober to be used is selected from plural probers and transported to a place of inspection of the liquid crystal substrate, it is necessary to provide a placing jig at a location where the probers are stored. Then, it is necessary to attach the jig to the inspection device, thereby further taking time. Accordingly, it is necessary to take a large labor force and a long working time for transporting the probers for replacement. Further, it is necessary to provide a rack for storing a large number of the probers, thereby taking a large space.

In view of the problems described above, an object of the present invention is to provide a liquid crystal substrate inspection apparatus for inspecting a substrate, in which it is possible to shorten a shutdown time of an inspection line for inspecting a liquid crystal substrate without transporting a prober manually, and eliminate a space of a rack for storing probers.

Further objects and advantages of the invention will be apparent from the following description of the invention.

SUMMARY OF THE INVENTION

In order to attain the objects described above, according to a first aspect of the present invention, a liquid crystal substrate inspection apparatus includes an inspection device for inspecting a liquid crystal substrate and a prober replacing device disposed adjacent to the inspection device. The prober replacing device has a conveying device for conveying a prober for inspecting a liquid crystal substrate. The inspection device and the prober replacing device are arranged next to each other, so that it is possible to shorten an inspection time of the liquid crystal substrate. The prober replacing device has the conveying device for automatically conveying the prober to the inspection device.

In the first aspect of the present invention, the conveying device may be formed of a robot mechanism such as a multiple-jointed robot and a loader robot with a chuck for holding the prober. The conveying device may be formed of a track conveying mechanism such as a mobile crane and a belt conveyer with a chuck for holding the prober. The conveying device may be formed of an automated guided vehicle with a chuck for holding the prober.

According to a second aspect of the present invention, a liquid crystal substrate inspection apparatus includes an inspection device for inspecting a liquid crystal substrate and a prober replacing device disposed adjacent to the inspection device for replacing a prober used for substrate inspection. The prober replacing device has a rack for storing the prober. The inspection device and the prober replacing device are arranged next to each other, so that it is possible to shorten an inspection time of the liquid crystal substrate. The prober replacing device has the rack for storing the prober, thereby eliminating a space of the rack.

In the second aspect of the present invention, the prober replacing device may have the rack for storing the prober for inspecting the liquid crystal substrate and a conveying device for selectively conveying the prober between the rack and the inspection device. Accordingly, it is possible to eliminate manual transportation, thereby shortening an inspection time of the liquid crystal substrate.

In the second aspect of the present invention, the conveying device may have a prober holding mechanism for holding and releasing the prober. Accordingly, it is possible to take out the prober corresponding to the liquid crystal substrate to be inspected from a plurality of probers stored in the rack, and to convey and set the prober in the inspection device. It is also possible to take out the prober from the inspection device and return the prober to the rack.

In the prober replacing device of the second aspect, the conveying device may have a conveying arm for moving the prober holding mechanism in a horizontal direction between the rack and the inspection device, and the rack may have a moving mechanism for moving the rack in a vertical direction. The rack is moved in the vertical direction, so that it is possible to select the prober stored in the rack. The prober holding mechanism is moved in the horizontal direction, so that it is possible to convey the prober between the rack and the inspection device. The conveying arm may have a mechanism for moving the prober in the vertical direction, so that the prober can be attached to the liquid crystal substrate in the inspection device and can be removed from the liquid crystal substrate.

As described above, according to the liquid crystal substrate inspection apparatus of the present invention, it is possible to automatically replace the prober, thereby eliminating manual replacement of the prober. It is possible to shorten a shutdown time of the inspection line for inspecting the liquid crystal substrate. It is also possible to eliminate a space of the rack for storing the prober.

DETAILED DESCRIPTION OF PREFERRED EMBODIMENTS

Figure 1:
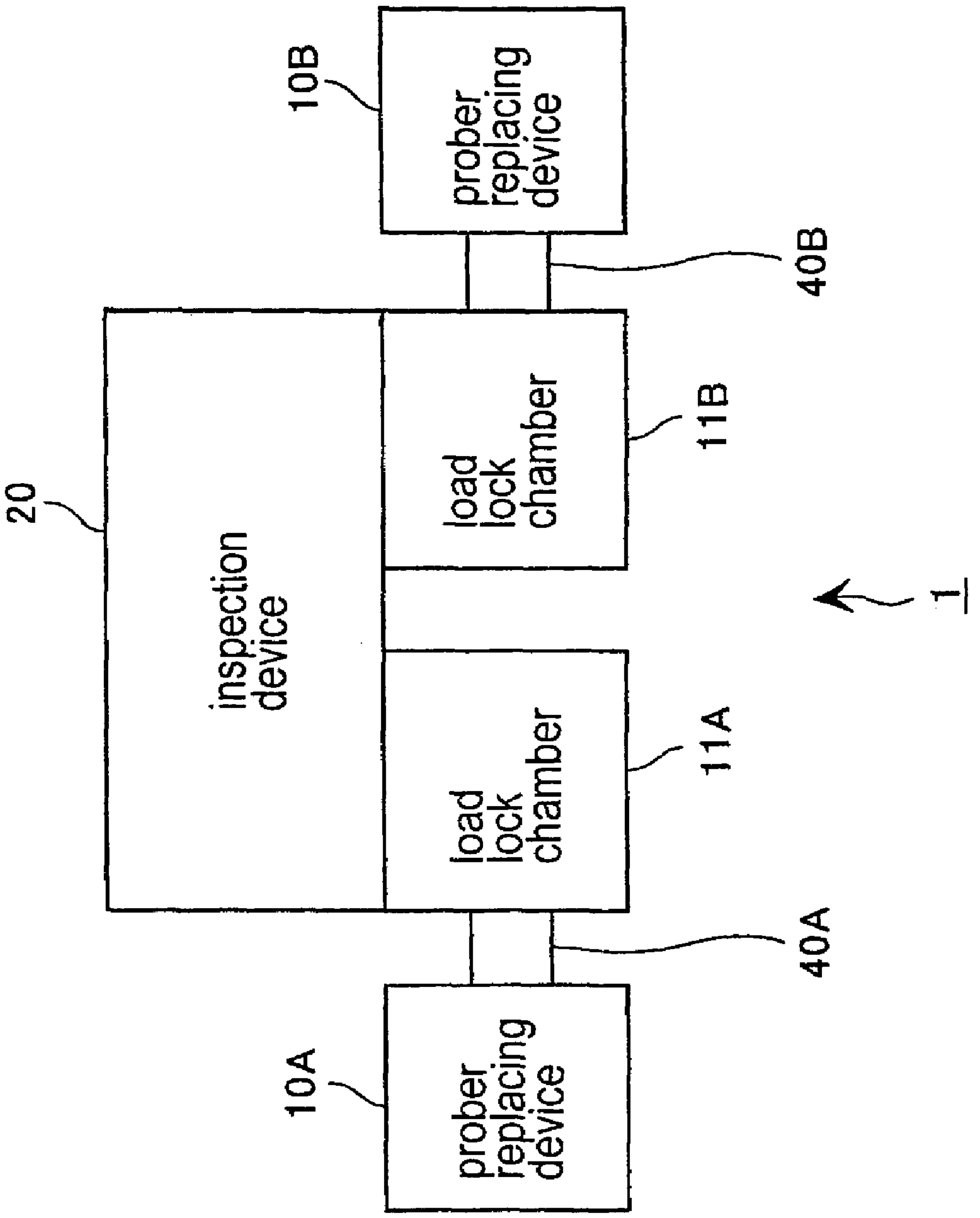
FIG. 1 is a schematic view for explaining a liquid crystal substrate inspection apparatus according to an embodiment of the present invention.

Hereunder, embodiments of the present invention will be explained in detail with reference to the accompanying drawings. FIG. 1 is a schematic view for explaining a liquid crystal substrate inspection apparatus according to an embodiment of the present invention. As shown in FIG. 1, a liquid crystal substrate inspection apparatus 1 includes an inspection device for inspecting a liquid crystal substrate and a prober replacing device disposed adjacent to the inspection device. The inspection device may be provided with a load lock chamber 11.

The load lock chamber 11 is attached to a liquid crystal substrate inspection device 20. A prober (not shown) is set to a liquid crystal substrate in the load lock chamber 11. A drive signal is applied for driving the liquid crystal substrates via the prober inside the inspection device 20, thereby conducting inspection. A control device (not shown) applies the drive signal to the prober and inspects the liquid crystal substrate in a driven state. A conveying device 40 conveys the liquid crystal substrate to the load lock chamber 11 and the liquid crystal substrate between the load lock chamber 11 and the inspection device 20.

The prober used for inspecting the liquid crystal substrate is selected and exchanged from probers prepared in advance in accordance with sizes, wiring arrangements, and the like of the liquid crystal substrate to be inspected. A prober replacing device 10 is attached to the load lock chamber 11 for automatically selecting and replacing the prober.

A plurality of load lock chambers 11A and 11B may be attached to the inspection device 20, and prober replacing devices 10A and 10B are combined respectively with each load lock chamber 11A and 11B. The load lock chamber 11 attached to the inspection device 20 and the prober replacing device 10 are not limited to two as shown in the drawings, and may be two or more if necessary. The load lock chamber 11 and the prober replacing device 10 are disposed in the inspection device 20. Accordingly, it is possible to simultaneously inspect a number of liquid crystal substrates to improve throughput, and simultaneously inspect different types of liquid crystal substrates.

Figure 2:
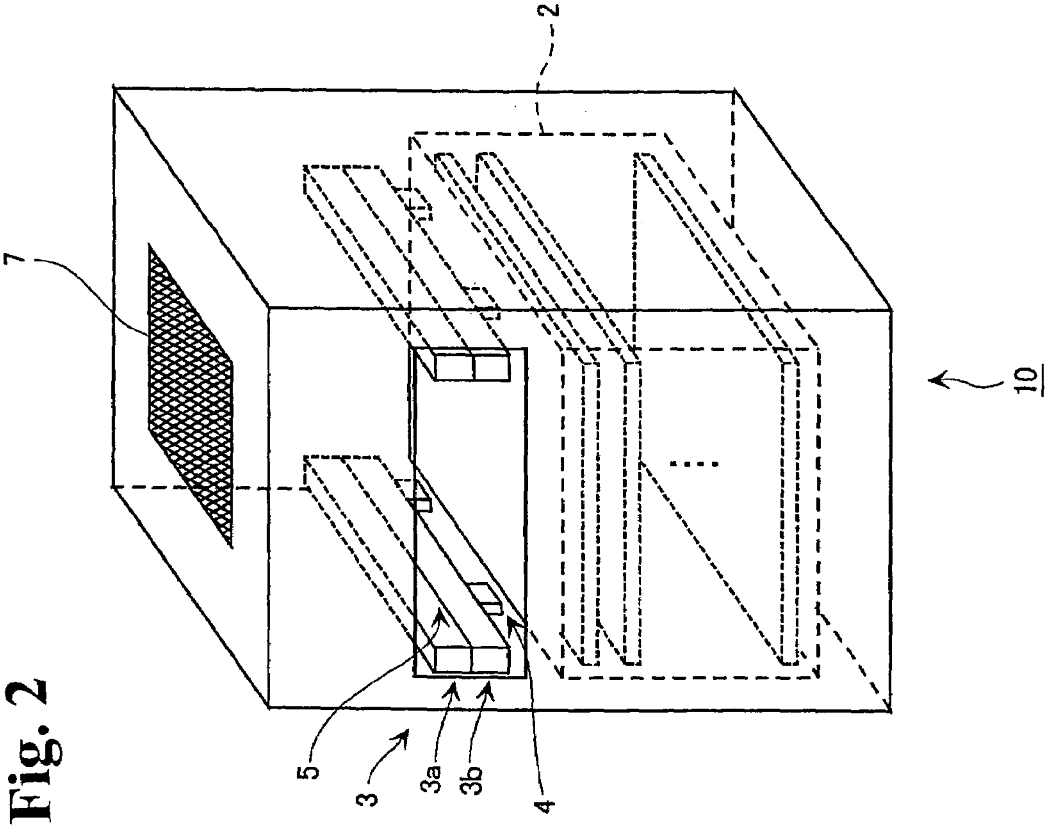
FIG. 2 is a perspective view showing a prober replacing device of the liquid crystal substrate inspection apparatus according to the embodiment of the present invention.

A conveying device 40 (40A, 40B) conveys the liquid crystal substrate between the prober replacing devices 10 (10A, 10B) and the load lock chamber 11 (11A, 11B) in the inspection device 20. FIG. 2 is a perspective view showing a prober replacing device of the liquid crystal substrate inspection apparatus according to the embodiment of the present invention. As shown in FIG. 2, the prober replacing device 10 integrally has a rack 2 for storing the prober (not shown) for inspecting the liquid crystal substrate (not shown), and a conveying device 3 for conveying the prober between the rack 2 and the load lock chamber 11 in the inspection device. The rack 2 has plural shelves for placing various probers corresponding to the types of liquid crystal substrates as object of inspection.

The conveying device 3 has a slide rail 3*a* and a conveying arm 3*b*. The conveying arm 3*b* slides along the slide rail 3*a* to move in a horizontal direction. The conveying arm 3*b* moves in the horizontal direction on the slide rail 3*a* in a state in which the prober is held on the conveying arm 3*b*, so that the prober moves between the prober replacing device 10 and the load lock chamber 11.

The conveying device 3 may also have a mechanism for moving the slide rail 3*a* and the conveying arm 3*b* in a vertical direction (up and down direction). With the mechanism, while the conveying arm 3*b* is moved toward the load lock chamber 11, the slide rail 3*a* and the conveying arm 3*b* are moved in the vertical direction (up and down direction). Accordingly, the prober can be moved in the vertical direction (up and down direction) in the load lock chamber 11, thereby attaching and removing the prober to and from the liquid crystal substrate.

The conveying arm 3*b* of the conveying device 3 has a prober holding mechanism 4 for freely holding and releasing the prober. The prober holding mechanism 4 has a chuck for engaging the prober and a driving part such as an air-pressure actuator for driving the chuck.

The rack 2 has the plural shelves for holding the probers, and a mechanism for moving the entire rack in the vertical direction (up and down direction). The mechanism moves the rack 2 up and down in a state while the rack 2 holds the probers. Accordingly, it is possible to position the prober holding mechanism 4 provided on the conveying arm 3*b* and the rack 2 in the vertical direction. As a result, it is possible to select and take out the prober from the probers held in the rack 2, and return the prober from the load lock chamber 11 to a specific shelf.

Instead of the moving mechanism provided in the rack 2, a moving mechanism may be provided for moving the slide rail 3*a* and the conveying arm 3*b* in the vertical direction (up and down direction). The conveying arm 3*b* performs a movement in the vertical direction to position the prober holding mechanism 4 and the rack 2 in the vertical direction. In this case, the moving mechanism of the rack 2 needs to have a sufficient amount of movement in the vertical direction to cover a height of the rack 2 in the vertical direction.

The rack 2 and the conveying device 3 may be supported with a support member (not shown) according to a use environment of the prober, so that the rack 2 and the conveying device 3 are used in an external atmospheric environment as well as inside a closed chamber. For example, when the prober replacing device and the inspection device are placed inside a clean room, the rack 2 and the conveying device 3 may be supported with a support member without being housed inside a chamber. When the rack 2 and the conveying device 3 are housed inside a chamber, an opening 5 is formed in a wall of the chamber at a transfer position of the prober, so that the conveying arm 3*b* and the prober are moved in and out of the chamber. A filter 7 such as a HEPA filter may be provided for a down flow.

Figure 3A:
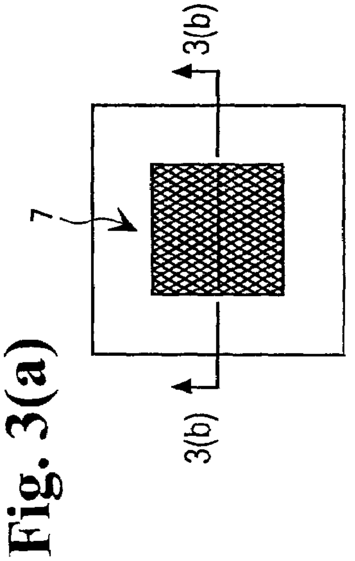
FIGS. 3(*a*) and 3(*b*) are a plan view and a sectional view showing the prober replacing device of the liquid crystal substrate inspection apparatus according to the embodiment of the present invention.
Figure 3B:
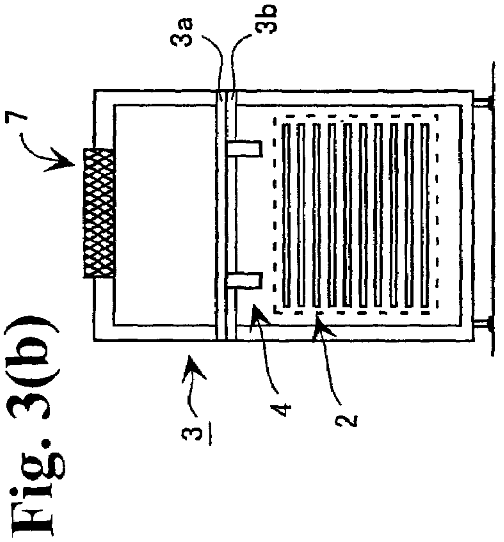

FIGS. 3(*a*), 3(*b*), 4(*a*) and 4(*b*) are a plan view, a sectional view, a front view, and a rear view of the prober replacing device. In FIGS. 3(*a*), 3(*b*), 4(*a*) and 4(*b*), the rack 2 and the conveying device 3 are housed inside a chamber. FIG. 3(*a*) is a plan view looking at the prober replacing device from above, and the filter 7 is provided in an opening formed in an upper wall surface. FIG. 3(*b*) is a cross section taken along 3(*b*)-3(*b*) in FIG. 3(*a*). As shown in FIG. 3(*b*), the rack 2 for storing the probers (not shown) and the conveying device 3 (slide rail 3*a* and conveying arm 3*b*) for conveying the probers are provided inside the chamber.

Figure 4A:
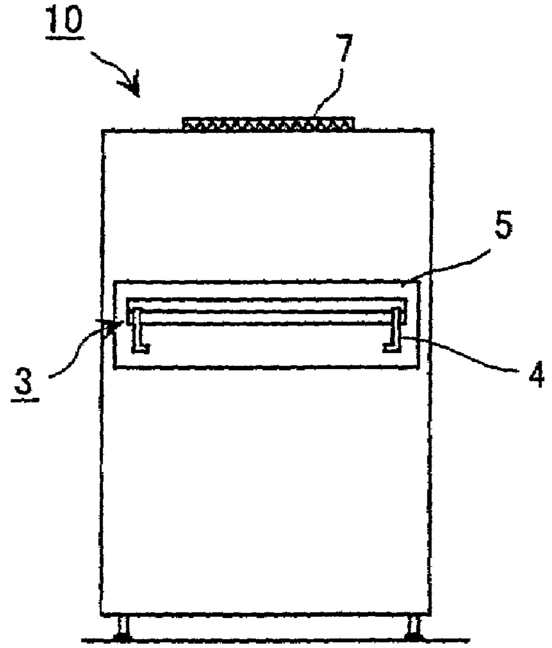
FIGS. 4(*a*) and 4(*b*) are a front view and a rear view showing the prober replacing device of the liquid crystal substrate inspection apparatus according to the embodiment of the present invention.
Figure 4B:
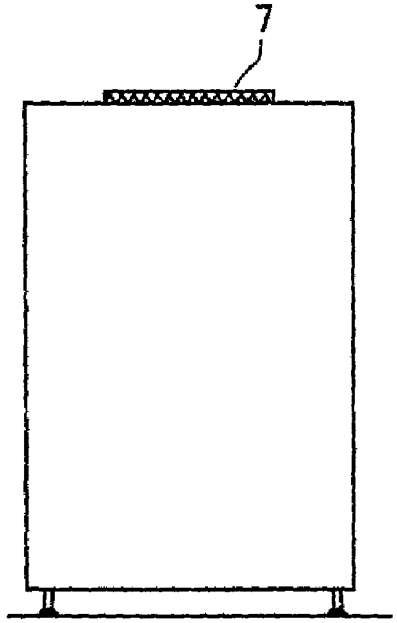

FIGS. 4(*a*) and (*b*) are a view looking at the prober replacing device from a side of the inspection device (load lock chamber 11) and a view looking from an opposite side. As shown in FIG. 4(*a*), the opening 5 is formed in the side wall surface of the inspection device (load lock chamber 11). The conveying arm 3*b* moves in and out through the opening 5, so that the prober (not shown) can be taken out from the rack 2 and move to the load lock chamber 11, and conversely the prober can be returned to the rack 2 from the load lock chamber 11. A door may be provided on the opening 5 for freely opening and closing, so that the opening 5 is closed while the conveying arm 3*b* is housed inside the chamber.

An operation of the prober inspection device will be explained next with reference to FIGS. 5(*a*) to 6(*c*). Hereunder, the operation includes a process in which the prober is selected and taken out from the prober replacing device, and the prober is conveyed to the inspection device (load lock chamber) and attached to the liquid crystal substrate for the inspection.

Figure 5A:
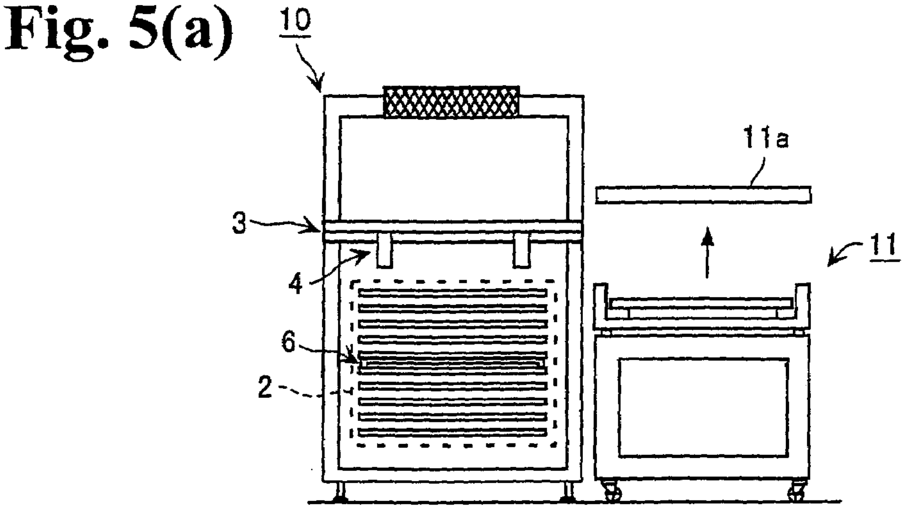
FIGS. 5(*a*) to 5(*c*) are views for explaining an operation of the prober replacing device of the liquid crystal substrate inspection apparatus according to the embodiment of the present invention.
Figure 5B:
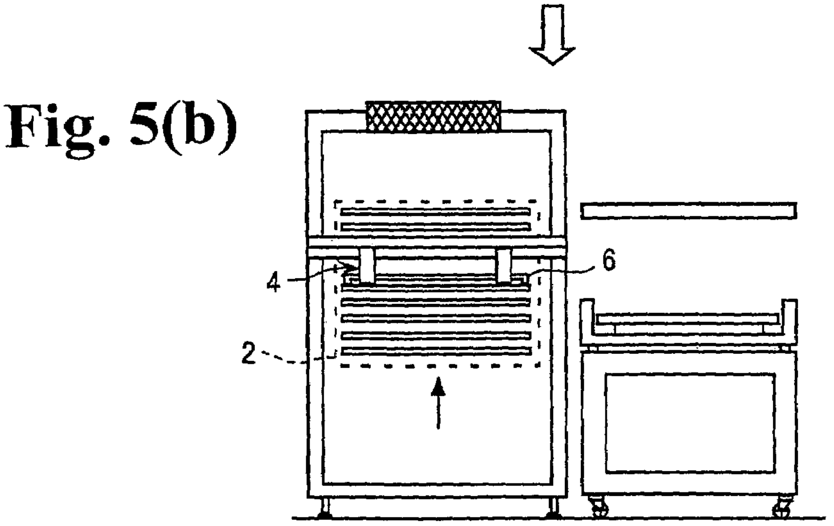
Figure 5C:
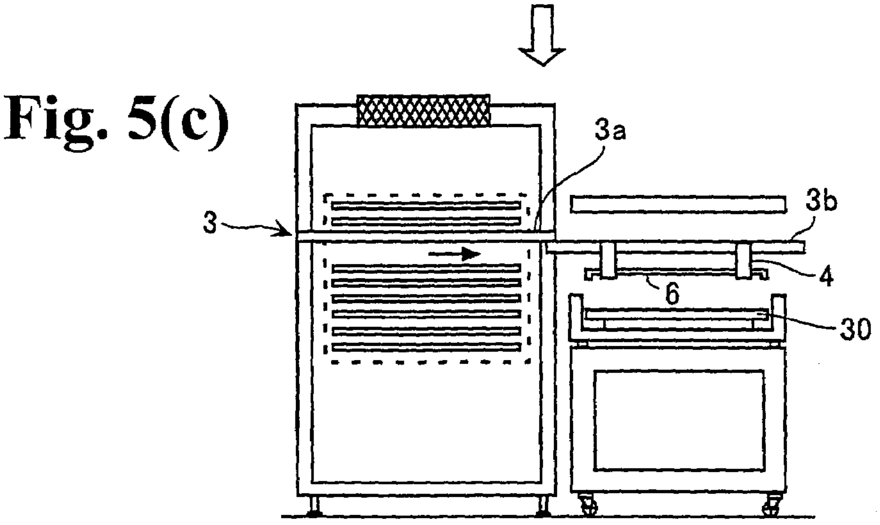

First, as shown in FIG. 5(*a*), the liquid crystal substrate 30 is not placed on top of a pallet (not shown) inside the load lock chamber 11. After the prober is moved to the load lock chamber 11, the liquid crystal substrate 30 is conveyed with a conveying device (not shown). In the load lock chamber 11, a ceiling plate 11*a* of the load lock chamber 11 is opened in order to place the prober 6 taken out from the prober replacing device 10 on the liquid crystal substrate 30.

The prober replacing device 10 stores the prober 6 for inspecting the liquid crystal substrate 30. Plural probers can be stored in accordance with various liquid crystal substrates. In the drawing, only one prober 6 is shown. At this time, the conveying device 3 is positioned at the transfer position, where the prober 6 is transferred to and from the rack 2, i.e., a position of the opening 5.

Next, as shown in FIG. 5(*b*), the prober replacing device 10 selects the prober corresponding to the liquid crystal substrate 30 as object of inspection from the probers stored on the rack 2, and drives the moving mechanism of the rack 2 to move the selected prober to the transfer position. Accordingly, the prober holding mechanism 4 can select and hold the prober 6.

As shown in FIG. 5(*c*), the conveying arm 3*b* moves in the horizontal direction along the slide rail 3*a* in a state in which the prober holding mechanism 4 holds the prober 6, so that the prober 6 is taken out of the prober replacing device 10 through the opening 5. The prober replacing device 5 and the load lock chamber 11 are arranged next to each other, so that the prober 6 taken out from the prober replacing device 10 is moved between the ceiling plate 11*a* of the load lock chamber 11 above the pallet on which the liquid crystal substrate 30 is placed. In this state, the conveying device (not shown) conveys the liquid crystal substrate on the pallet inside the load lock chamber 11.

Figure 6A:
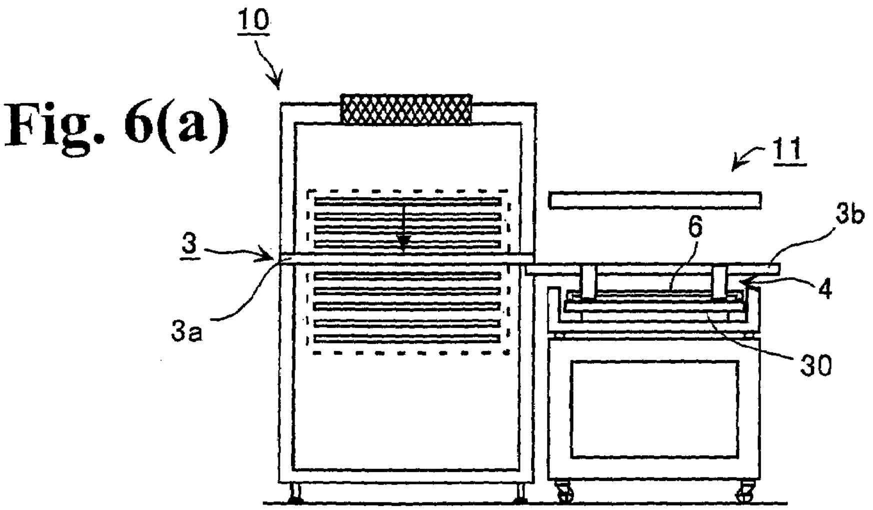
FIGS. 6(*a*) to 6(*c*) are views for explaining the operation of the prober replacing device of the liquid crystal substrate inspection apparatus according to the embodiment of the present invention.
Figure 6B:
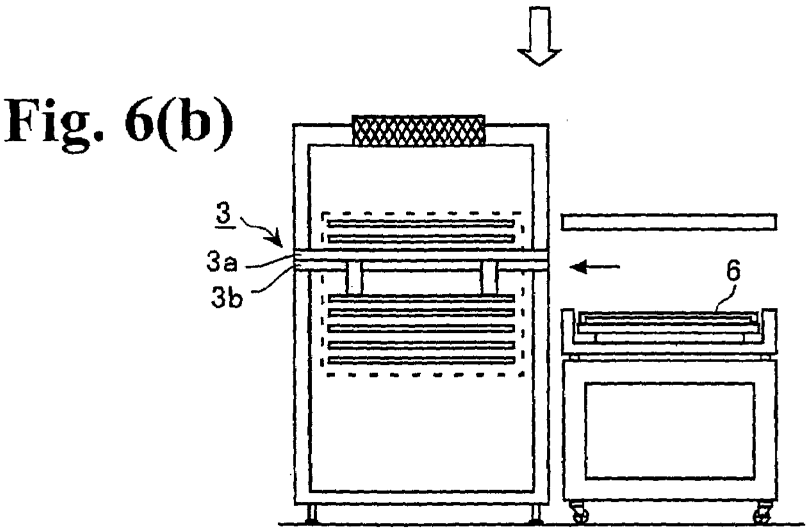
Figure 6C:
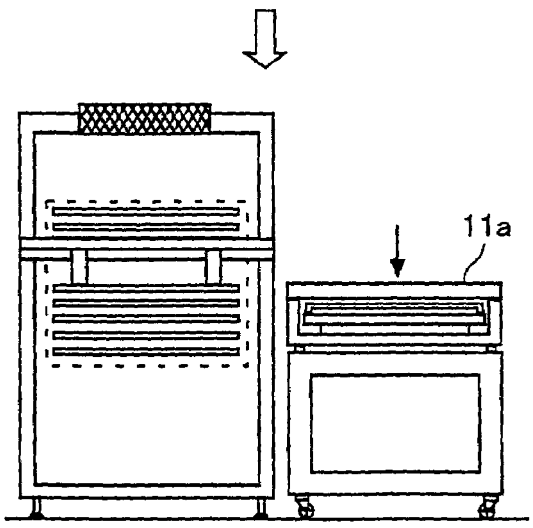

As shown in FIG. 6(*a*), the conveying arm 3*b* is moved upwardly with the moving mechanism of the conveying device 3. Accordingly, the prober 6 held by the prober holding mechanism 4 is placed on the liquid crystal substrate 30 disposed inside the load lock chamber 11.

The liquid crystal substrate 30 is positioned on the load lock chamber 11 at a specific position in advance. Further, the conveying device 3 moves the prober 6 to the load lock chamber 11 at a specific position. Accordingly, when the prober 6 is moved downwardly, it is possible to automatically position the prober 6 and the liquid crystal substrate 30. For the above positioning, one can adjust in advance the position of placement between the prober replacing device 10 and the load lock chamber 11, and the amount of advancement of the conveying arm 3*b*, and the like.

As shown in FIG. 6(*b*), the conveying arm 3*b* is moved along the slide rail 3*a* and is housed inside the prober replacing device 10. Then, as shown in FIG. 6(*c*), the ceiling plate 11*a* of the load lock chamber 11 is closed, and a contact of the prober 6 is electrically connected to a contact of the liquid crystal substrate 30. The liquid crystal substrate 30 is conveyed to the inspection device 20 together with the pallet. A drive signal is applied to the liquid crystal substrate 30 via the prober 6, and a driven state of the liquid crystal substrate 30 is inspected.

After the inspection of the liquid crystal substrate 30, the liquid crystal substrate 30 is returned from the inspection device 20 to the load lock chamber 11. The ceiling plate 11*a* is opened, so that the conveying arm 3*b* is extended to move the prober holding mechanism 4 above the liquid crystal substrate 30. Then, the conveying arm 3*b* is moved downwardly to hold the prober 6 on the liquid crystal substrate 30.

Next, the rack 2 is moved, so that the shelf for housing the prober 6 is moved to a position of the conveying arm 3*b*. The conveying arm 3*b* is contracted while holding the prober 6, so that the prober 6 is taken into the prober replacing device 10. After the prober 6 is taken into the prober replacing device 10, the prober holding mechanism 4 is released after positioning, and the prober 6 is returned to the shelf of the rack 2 and is housed.

A control device (not shown) controls the movement of the rack 2. In the movement control, information about the liquid crystal substrate as object of inspection is input from, for example, the inspection device 20. The prober is selected corresponding to the liquid crystal substrate, so that the prober is automatically moved based on information about the shelf the prober. For the movement control, information of a relationship between the liquid crystal substrate and the prober, and information about the rack housing the prober are stored in advance, and the information is read out each time the liquid crystal substrate as object of inspection is changed.

By repeating the process described above, even when the type of liquid crystal substrate as object of inspection is changed, it is possible to select the prober corresponding to the liquid crystal substrate as object of inspection from the probers housed in the rack 2, and attach the prober to the liquid crystal substrate on the load lock chamber for the inspection.

An operation of the prober holding mechanism will be explained with reference to FIGS. 7(*a*) to 7(*c*). The prober holding mechanism 4 has, for example, a chuck 4*a* having a coupling part 4*c* at a front end and an air-pressure actuator 4*b* for moving the chuck 4*a* in the horizontal direction to hold and release the prober 6. The prober holding mechanism 4 is attached to the conveying arm 3*b*. In the following description, pairs of chucks 4*a*, air-pressure actuators 4*b*, and coupling parts 4*c* are provided for holding the prober from both ends.

The prober 6 has coupling parts 6*a* for engaging the coupling parts 4*c* of the chucks 4*a*. The coupling parts 6*a* and the coupling parts 4*c* are positioned for engagement. FIGS. 7(*a*) to 7(*c*) are views showing an operation of holding the prober. FIG. 7(*a*) shows a state in which the rack 2 is moved in the vertical direction relative to the prober holding mechanism 4 at a specific position (for example, transfer position), and the prober 6 to be used is positioned at the driving position of the prober holding mechanism 4.

Figures 7A, 7B, 7C:
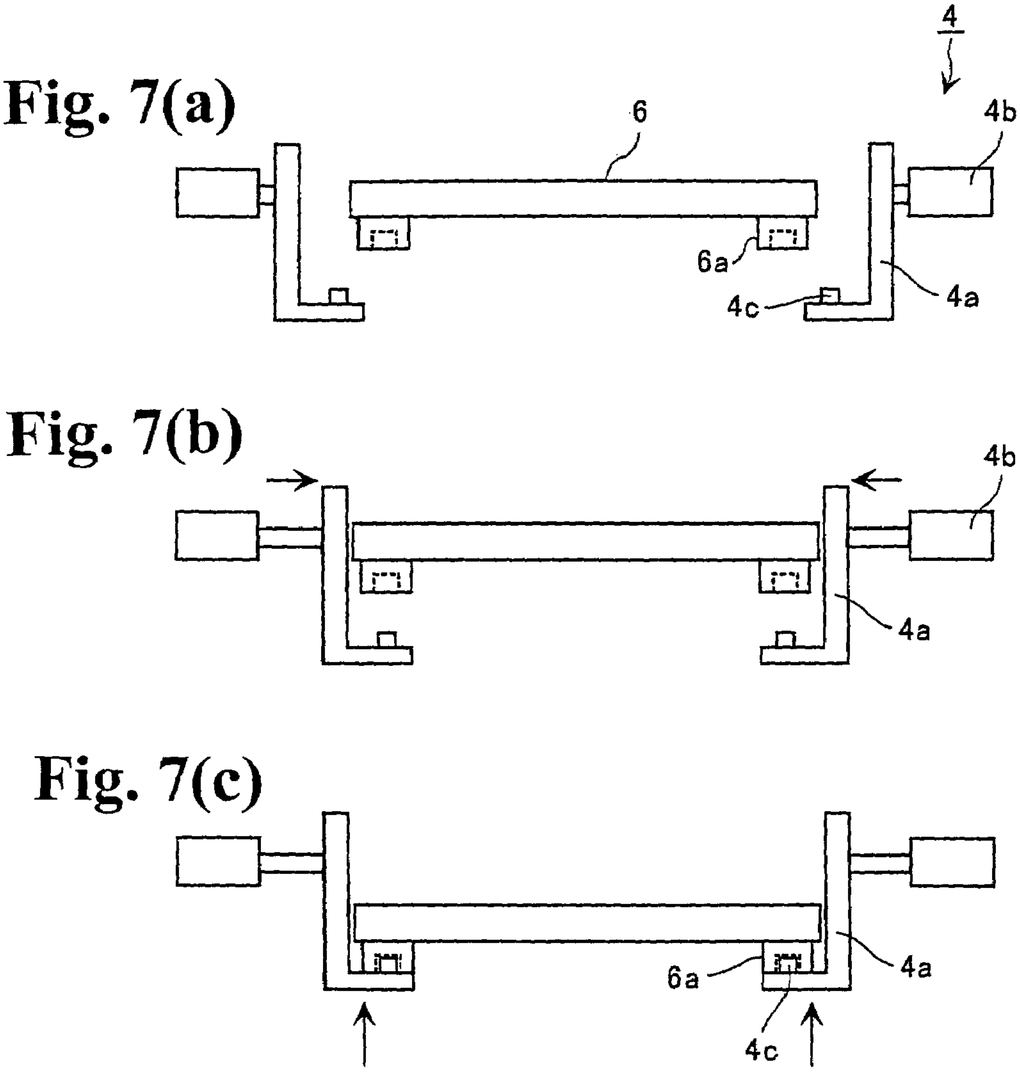
FIGS. 7(*a*) to 7(*c*) are views for explaining an operation of a prober holding mechanism of the liquid crystal substrate inspection apparatus according to the embodiment of the present invention.

After the positioning, as shown in FIG. 7(*b*), the air-pressure actuators 4*b* are driven and the chucks 4*a* are placed around both sides of the prober 6. As shown in FIG. 7(*b*), the prober holding mechanism 4 or the rack 2 is moved in the vertical direction, and the coupling parts 4*c* of the chucks 4*a* and the coupling parts 6*a* of the prober 6 engage. Accordingly, the prober 6 is held by the prober holding mechanism 4, and is moved by the conveying arm 3*b*.

Figure 8A:
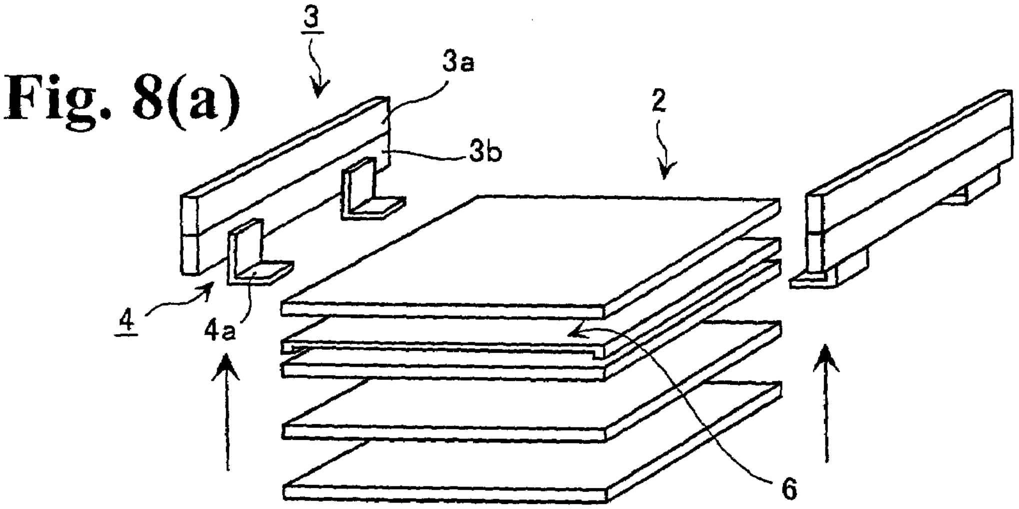
FIGS. 8(*a*) to 8(*c*) are views for explaining an operation of a conveying device of the liquid crystal substrate inspection apparatus according to the embodiment of the present invention.
Figure 8B:
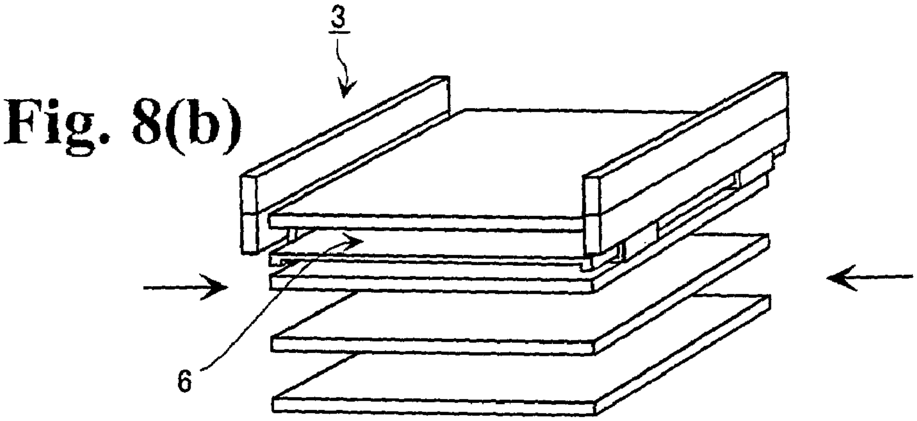
Figure 8C:
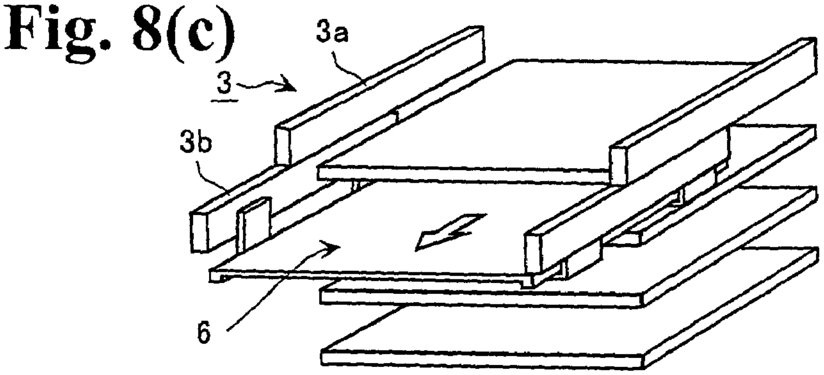

FIGS. 8(*a*) to 8(*c*) are views for explaining an operation of the conveying device 3 and the prober holding mechanism 4 for selecting and extracting the prober. In FIGS. 8(*a*) to 8(*c*), constituent parts other than the conveying device 3, prober holding mechanism 4, and rack 2 are omitted. As shown in FIG. 8(*a*), the rack 2 is moved in the vertical direction (up direction in the drawing), and the prober 6 is aligned to a height of the conveying device 3 and the prober holding mechanism 4. At this time, the prober holding mechanism 4 is moved to outside so as not to obstruct the rack 2.

After positioning the rack 2, as shown in FIG. 8(*c*), the prober holding mechanism 4 is driven (in an arrow direction in FIG. 8(*b*)), and the conveying device 3 and the chuck 4*a* are positioned on the prober 6, so that the prober 6 is held by the chuck 4*a*. Then, as shown in FIG. 8(*c*), the conveying arm 3*b* is moved on the slide rail 3*a* (in an arrow direction in FIG. 8(*c*)), and the held prober 6 is conveyed out of the rack 2.

Figure 9A:
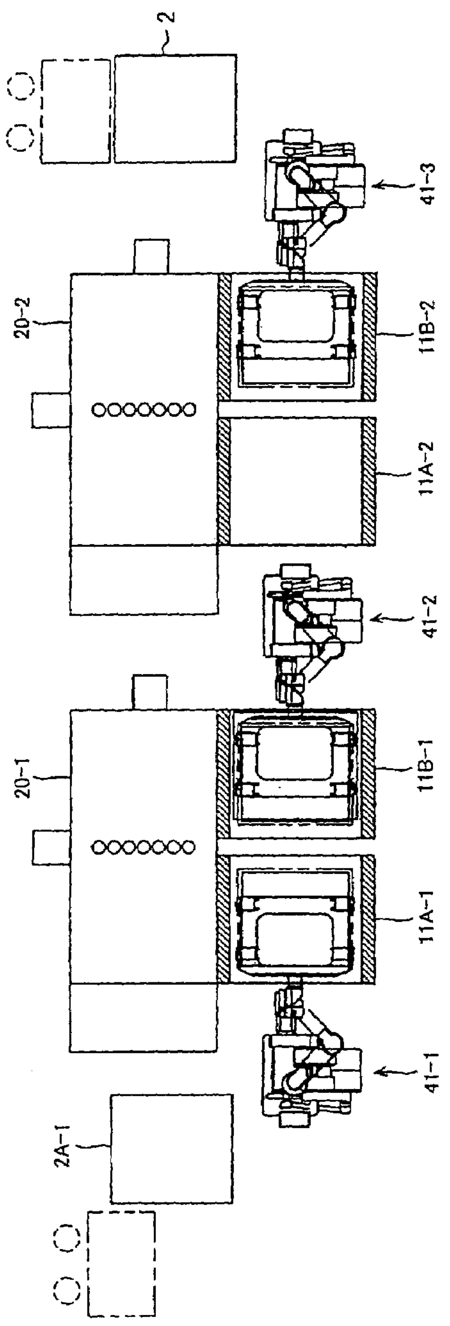
FIGS. 9(*a*) and 9(*b*) are a plan view and a front view showing an example of the conveying device using a robot mechanism.
Figure 9B:
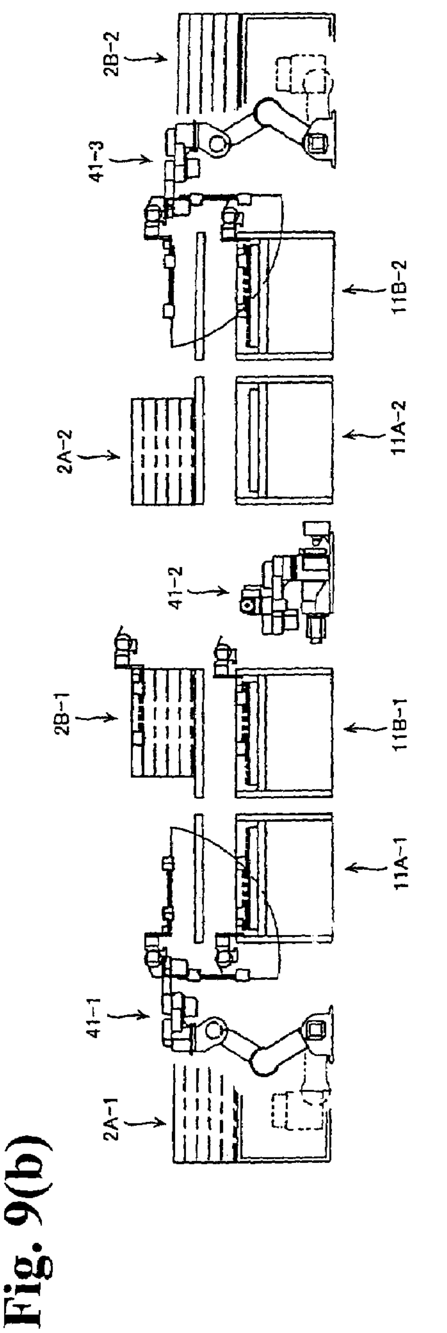

Hereunder, examples of the conveying device for conveying the prober for inspecting the liquid crystal substrate will be explained with reference to FIGS. 9(*a*) to 14. The conveying device may include a robot mechanism. FIGS. 9(*a*), 9(*b*) and 10 are schematic views showing examples of the conveying device using the robot mechanism.

FIGS. 9(*a*) and 9(*b*) are views showing an example of the conveying device using the robot mechanism formed of a multiple-jointed robot. FIG. 9(*a*) is a view looking at the conveying device from above, and FIG. 9(*b*) is a view looking at the conveying device from the front. The structure has two inspection devices 20-1 and 20-2. The inspection device 20-1 has two load lock chambers 11A-1 and 11B-1, and racks 2A-1 and 2B-1 for holding the probers. The inspection device 20-2 has two load lock chambers 11A-2 and 11B-2, and racks 2A-2 and 2B-2 for holding the prober.

In FIGS. 9(*a*) and 9(*b*), the liquid crystal substrate inspection apparatus has three multiple-jointed robots 41-1, 41-2 and 41-3 as the conveying devices for conveying the prober between the racks and the load lock chambers. The multiple-jointed robots 41 can convey the prober between any rack and load lock chamber. In the embodiment, the multiple-jointed robot 41-1 conveys the prober between the rack 2A-1 and the load lock chamber 11A-1, and the multiple-jointed robot 41-2 conveys the prober between the rack 2B-1 and the rack 2A-1, and the load lock chamber 11B-1 and the load lock chamber 11A-2. The multiple-jointed robot 41-3 conveys the prober between the rack 2B-1 and the load lock chamber 11B-2.

Figure 10:
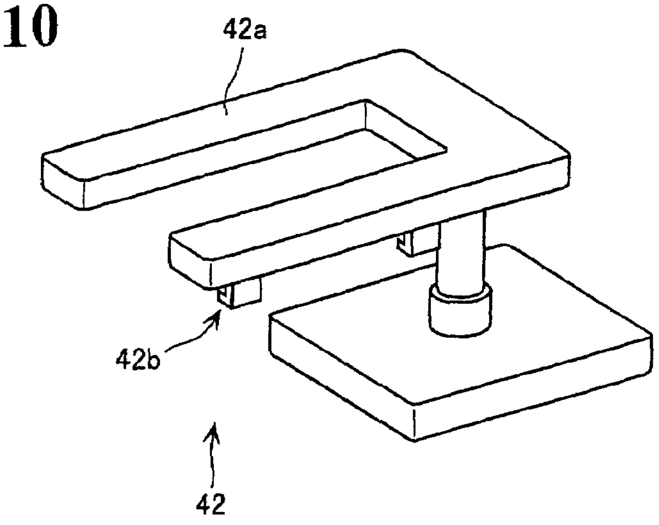
FIG. 10 is a view showing another example of the conveying device using the robot mechanism.

FIG. 10 is a view showing another example of the conveying device using the robot mechanism formed of a loader robot 42. The loader robot 42 has a loader arm 42*a* for performing a rotational movement and vertical movement, and the loader arm 42*a* has a chuck 42*b* for holding the prober (not shown). The loader robot 42 can be placed at a position where, for example, the multiple-jointed robot 41 is placed in the structure shown in FIGS. 9(*a*) and 9(*b*). As the robot mechanism, in addition to the multiple-jointed robot and loader robot, a humanoid robot also can be used.

Figure 11:
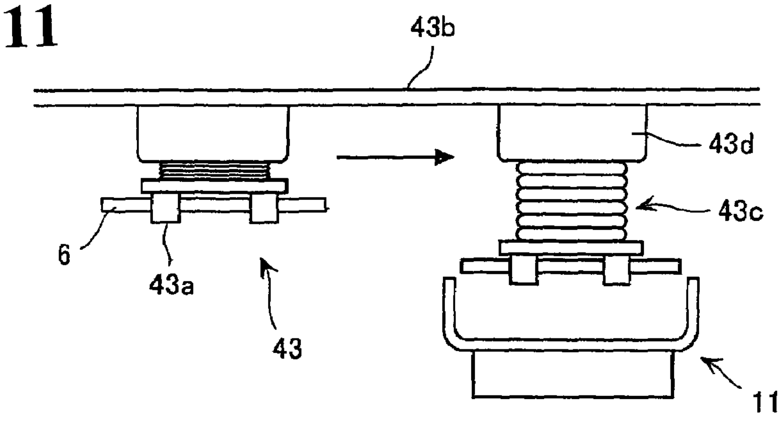
FIG. 11 is a view showing an example of the conveying device using a track conveying mechanism formed of a mobile crane.
Figure 12:
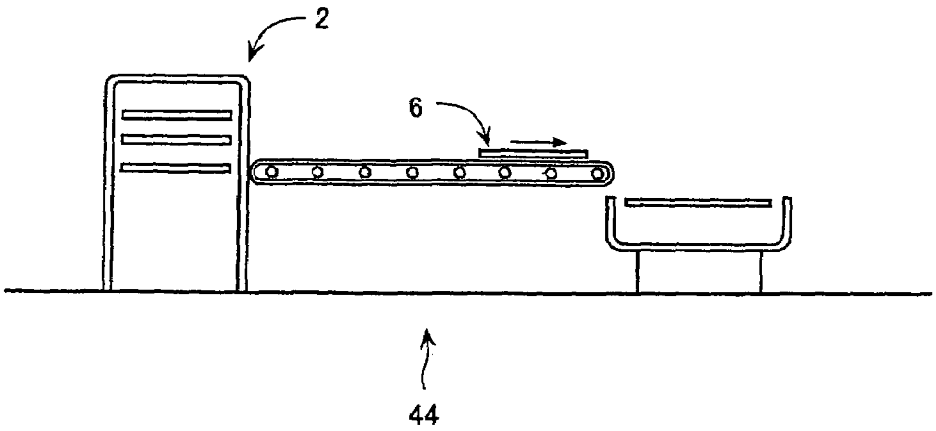
FIG. 12 is a view showing an example of the conveying device using the track conveying mechanism formed of a belt conveyer.

The conveying device may include a track conveying mechanism. FIG. 11 and FIG. 12 are schematic views showing examples of the conveying devices using the track conveying mechanisms. The track conveying mechanism conveys with a conveying mechanism moving on a laid track.

FIG. 11 is a view showing the conveying device using the track conveying mechanism formed of a mobile crane 43. In the mobile crane 43, a rail 43*b* is laid on a ceiling, and a mobile mechanism 43*c* moves along the rail 43*b*. The mobile mechanism 43*c* has a chuck 43*a* for holding a prober 6, and moves along the rail 43*b* in a state in which the prober is held by the chuck 43*a*. An extension mechanism 43*d* is provided on the mobile mechanism 43*c*, so that the chuck 43*a* can move up and down.

FIG. 12 is a view showing an example of the conveying device using the track conveying mechanism formed of a belt conveyer 44. In the belt conveyer 44, an endless track can convey the prober between the rack 2 and the load lock chamber 11.

Figure 13:
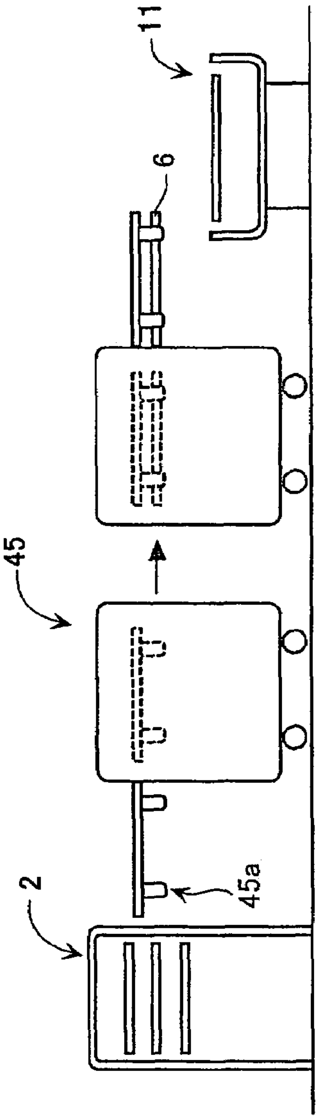
FIG. 13 is a view showing an example of the conveying device using an automated guided vehicle.

The conveying device may include an automated guided vehicle (AGV). FIG. 13 is a view showing an example of the conveying device using the automated guided vehicle 45. The automated guided vehicle 45 has a chuck 45*a* for holding and moving the prober 6 in a state in which the prober is held by the chuck 45*a*, so that the prober is conveyed between the rack 2 and the load lock chamber 11.

Figure 14:
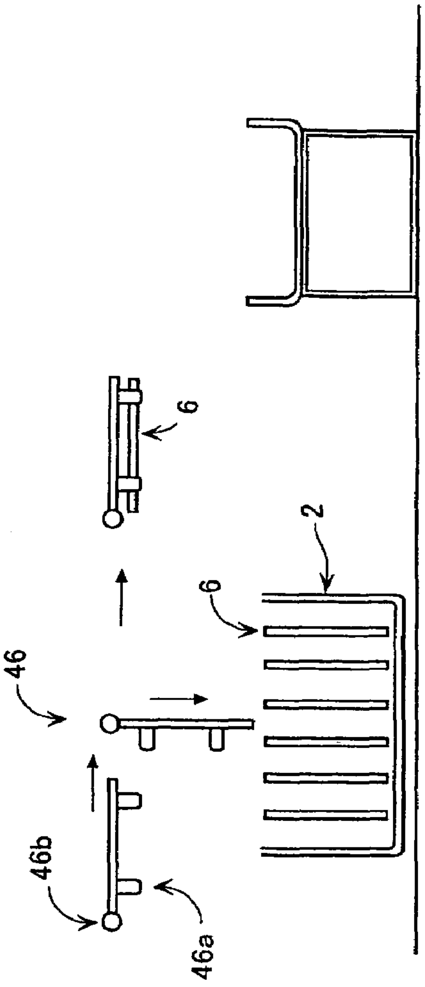
FIG. 14 is a view showing an example of the conveying device using a rotating arm type conveying device.

The conveying device may include a rotating arm type conveying device. FIG. 14 is a view showing an example of the conveying device using the rotating arm type conveying device 46. The rotating arm type conveying device 46 has a chuck 46*a* for holding the prober 6 on an arm. The arm is rotated freely with a rotating mechanism 46*b*. The rotating arm type conveying device 46 moves in a state in which the prober is held by the chuck 46*a*, so that the prober is conveyed between the rack 2 and the load lock chamber 11.

The rack stores the prober 6 in the vertical direction. The rotating arm type conveying device 46 rotates the arm in the vertical direction with the rotating mechanism 46*b* and inserts the arm into the rack 2. The prober 6 stored vertically in the rack 2 is held by the chuck 46*b*. The rotating arm type conveying device 46 extracts the prober 6 held by the chuck 46*b*. After rotating the prober 6 in the horizontal direction, the rotating arm type conveying device 46 conveys the prober 6 to the load lock chamber 11.

Figure 15A:
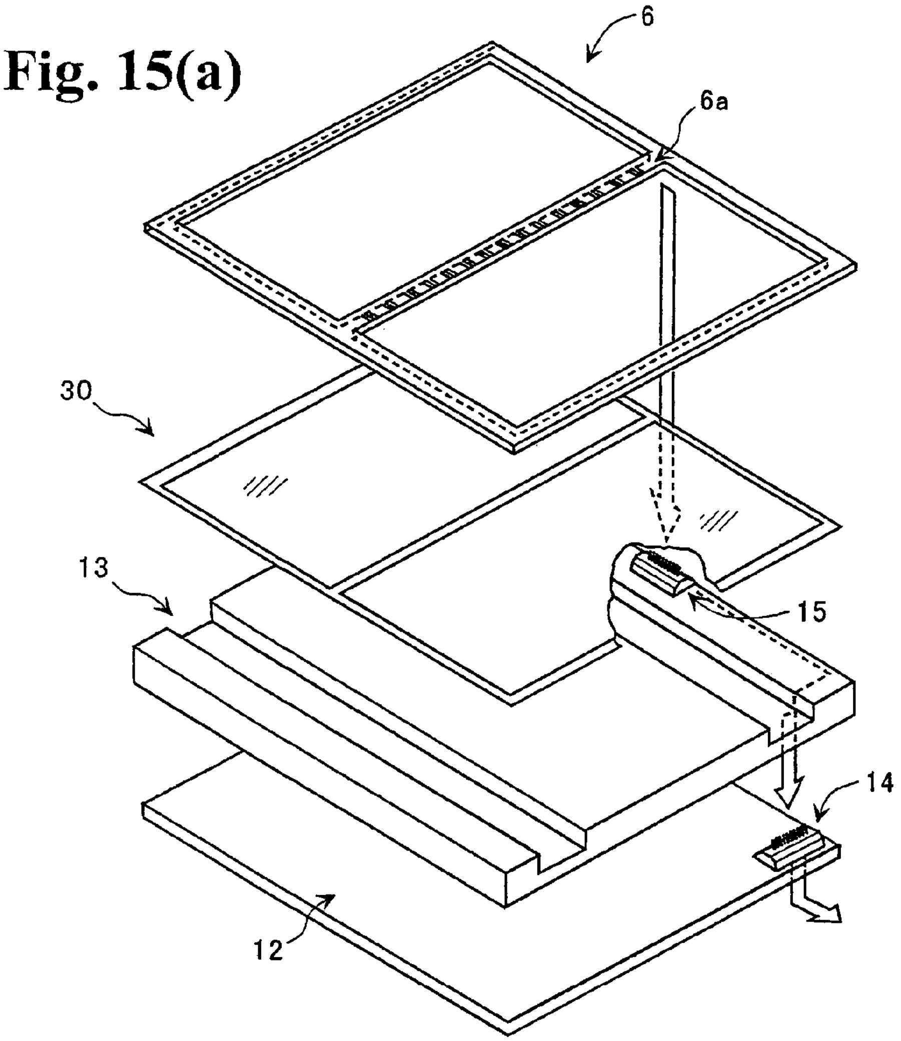
FIGS. 15(*a*) and 15(*b*) are views for explaining a positional relationship between a prober and a substrate in the liquid crystal substrate inspection apparatus according to the embodiment of the present invention.
Figure 15B:
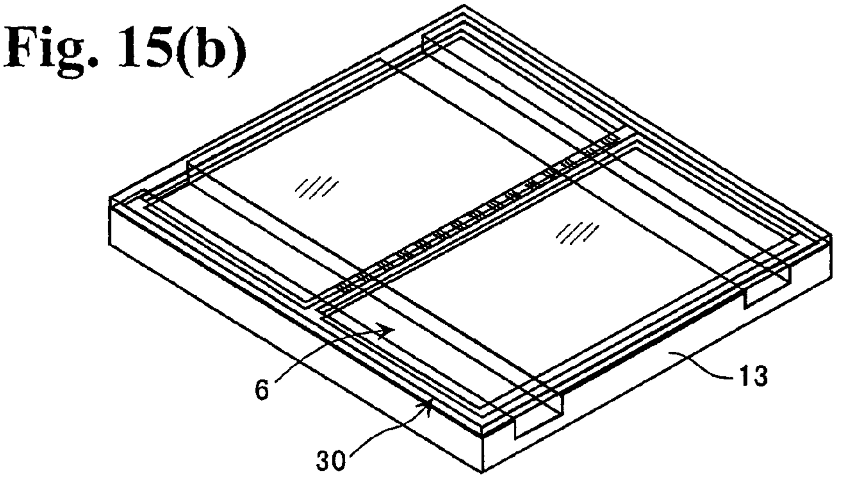

FIGS. 15(*a*) and 15(*b*) are views for explaining a positional relationship between the prober and the substrate on the load lock chamber 11. The substrate 30 held on a pallet 13 is conveyed from the inspection device 20, and is placed on a stage 12 in the load lock chamber 11. The prober 6 is conveyed from the prober replacing device 10 and placed on the liquid crystal substrate 30 with the conveying device 3. The stage 12 is electrically connected to the pallet 13 through a connector 14, and the pallet 13 is electrically connected to the prober 6 through a connector 15. The prober 6 has plural probe pins 6*a* on a side facing the liquid crystal substrate. When the prober 6 is placed on the liquid crystal substrate, the probe pins 6*a* electrically contact contacts (for example, formed of electrode pads) on the liquid crystal substrate 30, so that a drive signal is applied to the liquid crystal substrate 30.

In FIGS. 15(*a*) and 15(*b*), the drive signal transmitted from the control device (not shown) is sent from the stage 12 to the pallet 13 via the connector 14. The drive signal is sent from the pallet 13 to the prober 6 via the connector 15. Then, a drive signal is sent from the probe pins 6*a* to the liquid crystal substrate 30.

In FIG. 15(*a*), only the connector 14 on the stage 12 is shown as a connector for connecting between the stage 12 and the pallet 13. Also, only the connector 15 on the pallet 13 is shown as a connector for connecting between the pallet 13 and the prober 6. FIG. 15(*b*) shows a state in which the liquid crystal substrate 30 and the prober 6 are placed on the pallet 13. The liquid crystal substrate 30 is schematically shown in FIGS. 15(*a*) and 15(*b*) for explanation, and can be formed arbitrarily in accordance with a specification of the liquid crystal substrate.

In the liquid crystal substrate inspection apparatus of the present invention, the control device automatically perform the processes of seeking the prober corresponding to the liquid crystal substrate as object of inspection; identifying the shelf of the rack on which the prober is stored; and conveying the prober to the inspection device. Accordingly, it is possible to shorten a time for replacing the prober and a time for shutting down an inspection line for inspection of the liquid crystal substrates.

In the liquid crystal substrate inspection apparatus of the present invention, the rack for storing the probers is disposed in the prober replacing device. Accordingly, it is not necessary to provide a space for storing the probers.

The disclosure of Japanese Patent Application No. 2004-039478, filed on Feb. 17, 2004, is incorporated in the application.

While the invention has been explained with reference to the specific embodiments of the invention, the explanation is illustrative and the invention is limited only by the appended claims.

What is claimed is:

1. A liquid crystal substrate inspection apparatus, comprising:

an inspection device for inspecting a liquid crystal substrate, a plurality of probers for the inspection device, one of the probers being electrically connected to the inspection device when the liquid crystal substrate is inspected, and a prober replacing device disposed adjacent to the inspection device and having a rack for storing said plurality of probers, and a conveying device for conveying one of the probers between the rack and the inspection device for inspecting the liquid crystal substrate.

2. A liquid crystal substrate inspection apparatus according to claim 1, wherein said conveying device includes a robot mechanism having a chuck for holding the prober.

3. A liquid crystal substrate inspection apparatus according to claim 2, wherein said robot mechanism is a multiple-jointed robot or a loader robot.

4. A liquid crystal substrate inspection apparatus according to claim 1, wherein said conveying device includes a track conveying mechanism having a chuck for holding the prober.

5. A liquid crystal substrate inspection apparatus according to claim 4, wherein said track conveying mechanism includes a mobile crane or a belt conveyer.

6. A liquid crystal substrate inspection apparatus according to claim 1, wherein said conveying device includes an automated guided vehicle having a chuck for holding the prober.

7. A liquid crystal substrate inspection apparatus according to claim 1, wherein said conveying device further includes a prober holding mechanism for holding and releasing the prober.

8. A liquid crystal substrate inspection apparatus according to claim 7, wherein said conveying device includes a conveying arm for moving the prober holding mechanism in a horizontal direction between the rack and the inspection device, said rack having a moving mechanism for moving the rack in a vertical direction.

9. A liquid crystal substrate inspection apparatus, comprising:

an inspection device for inspecting a liquid crystal substrate, a plurality of probers for the inspection device, one of the probers being electrically connected to the inspection device when the liquid crystal substrate is inspected, and a prober replacing device disposed adjacent to the inspection device and having a rack for holding said plurality of probers, and a conveying device for conveying one of the probers between the rack and the inspection device for inspecting the liquid crystal substrate, wherein said conveying device further includes a prober holding mechanism for holding and releasing the prober, and a conveying arm for moving the prober holding mechanism in a horizontal direction between the rack and the inspection device, said rack having a moving mechanism for moving the rack in a vertical direction, and wherein said plurality of probers are different from each other for inspecting different kind of liquid crystal substrates.

* * * * *